(12) United States Patent
Moeller et al.

(10) Patent No.: US 6,594,093 B2
(45) Date of Patent: Jul. 15, 2003

(54) ADJUSTING APPARATUS FOR AN OPTICAL ELEMENT IN A LENS SYSTEM

(75) Inventors: Timo Moeller, Westhausen (DE); Bernhard Gellrich, Aalen (DE)

(73) Assignee: Carl Zeiss Semiconductor Manufacturing Technologies AG, Oberkochen (DE)

( * ) Notice: Subject to any disclaimer, the term of this patent is extended or adjusted under 35 U.S.C. 154(b) by 0 days.

(21) Appl. No.: 10/039,841

(22) Filed: Jan. 3, 2002

(65) Prior Publication Data

US 2002/0089766 A1 Jul. 11, 2002

(30) Foreign Application Priority Data

Jan. 8, 2001 (DE) .......................................... 101 00 546

(51) Int. Cl.⁷ ................................................. G02B 7/02
(52) U.S. Cl. ....................................... 359/824; 359/814
(58) Field of Search .............................. 359/811, 812, 359/813, 814, 819, 822, 823, 824

(56) References Cited

U.S. PATENT DOCUMENTS

| | | | |
|---|---|---|---|
| 6,198,579 B1 * | 3/2001 | Rupp | ........................ 359/820 |
| 6,239,924 B1 * | 5/2001 | Watson et al. | ............... 359/819 |
| 6,366,413 B1 * | 4/2002 | Trunz et al. | ................. 359/811 |
| 6,400,516 B1 * | 6/2002 | Spinali | ........................ 359/819 |
| 6,445,515 B2 * | 9/2002 | Moennig | ..................... 359/814 |

FOREIGN PATENT DOCUMENTS

| | | |
|---|---|---|
| DE | 199 05 779.6 | 2/1999 |
| EP | 1 035 426 A2 | 2/2000 |

* cited by examiner

*Primary Examiner*—Georgia Epps
*Assistant Examiner*—Saeed Seyrafi
(74) *Attorney, Agent, or Firm*—Wells St. John P.S.

(57) ABSTRACT

In the case of an adjusting apparatus for an optical element in a lens system, in particular a lens in a projection lens system for semiconductor lithography, for producing tilting movements, having at least one actuator, the optical element is connected via elastic connecting members, directly or indirectly via an inner mount, to an outer mount. The elastic connecting members or the at least one actuator are/is provided in each case with bearing bridges which have bearing locations for a connection to the optical element or to the inner mount, and bridge arms which are connected to the bearing locations. The bridge arms are provided with piezoceramic elements in plate or sheet form which undergo changes in length upon activation. The piezoceramic elements of the various bearing bridges can be activated individually or together.

24 Claims, 1 Drawing Sheet

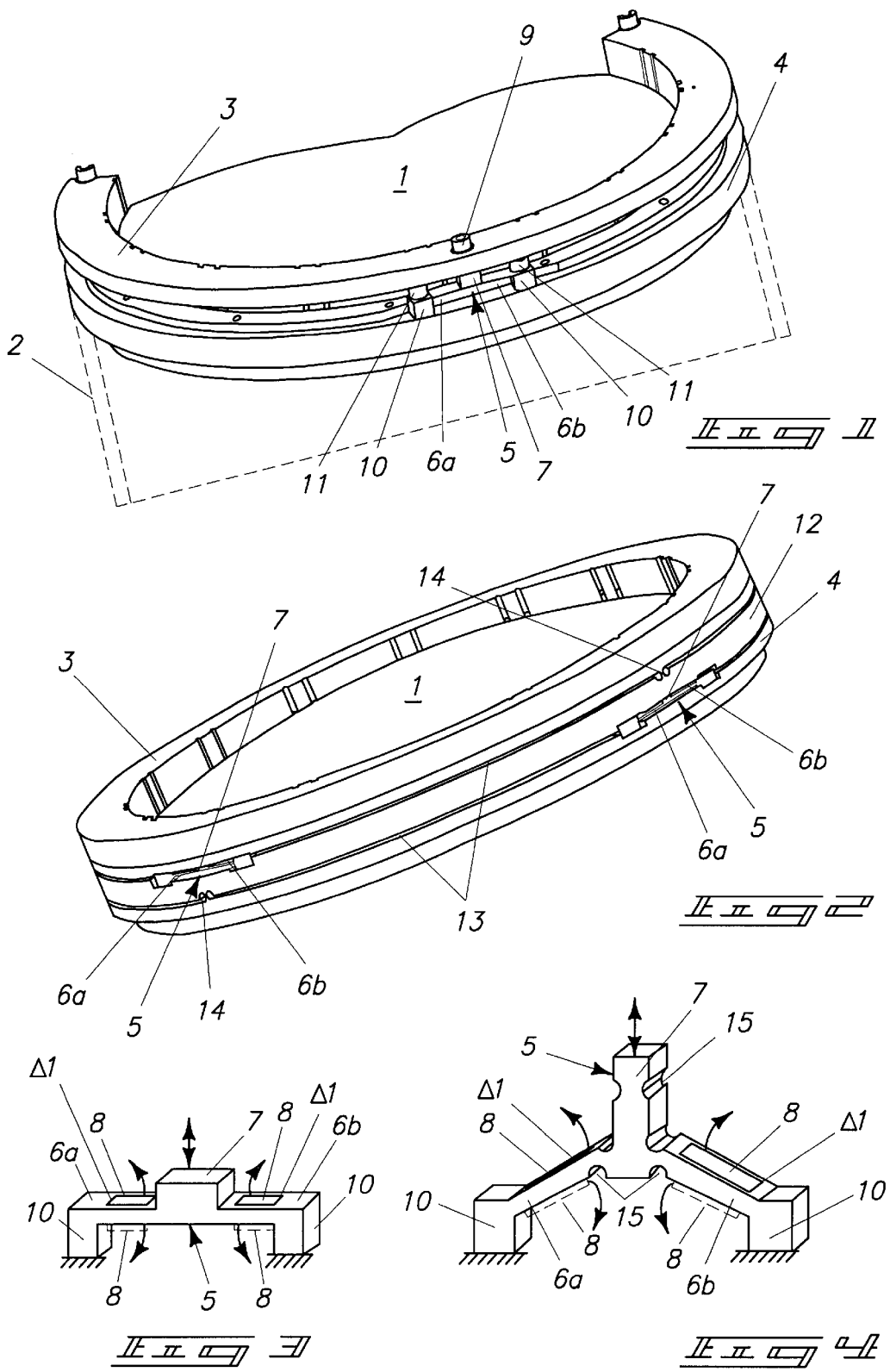

ADJUSTING APPARATUS FOR AN OPTICAL ELEMENT IN A LENS SYSTEM

RELATED APPLICATIONS

This application relates to and claims priority to corresponding German Patent Application No. 101 00 546.6 filed on Jan. 8, 2001.

BACKGROUND OF THE INVENTION

1. Field of the Invention

The invention relates to an apparatus for adjusting an optical element in a lens system. More particularly the invention relates to a lens in a projection exposure objective for semiconductor lithography.

2. Description of the Related Art

In a projection exposure objective for manufacturing semiconductors, the optical elements, e.g. lenses, have to be adjusted extremely precisely. For the precise adjustment, it is also necessary to have manipulators or actuators which can displace the optical element in the $\mu$-range and can tilt the optical element in the $\mu$m-rad range.

For this purpose, DE 199 05 779 has already disclosed the practice of connecting the inner mount and outer mount of a lens to one another via elastic connecting members. Tilting positions of the optical element can be adjusted by adjusting elements with a plurality of connecting rods.

EP 1 035 426 A1 has likewise already described an apparatus for displacing an optical element, a retaining ring being connected to a supporting ring via elastic solid-state articulations.

SUMMARY OF THE INVENTION

The object of the present invention is to provide an apparatus of the type mentioned in the introduction in which, by means of highly precisely operating manipulators or actuators, it is possible to execute tilting of an optical element in the $\mu$m-rad range and, if appropriate, displacements in the z-direction.

According to the invention, this object is achieved by an adjusting apparatus for an optical element in a lens system, for producing tilting movements, having at least one actuator, the optical element being connected via elastic connecting members, directly or indirectly via an inner mount, to an outer mount, wherein the elastic connecting members or the at least one actuator are/is provided in each case with bearing bridges which have bearing locations for a connection to the optical element, or the inner mount, and bridge arms which are connected to the bearing locations, said bridge arms being provided with piezoceramic elements in plate or sheet form which undergo changes in length upon activation, wherein said piezoceramic elements of the various bearing bridges are activatable, individually or together.

The optical element can be a lens in a projection exposure objective for semiconductor lithography.

The configuration according to the invention of the elastic connecting members and the actuation thereof via the highly responsive and very sensitive piezoceramic elements as actuators make it possible to execute tilting in the $\mu$m-rad range. If all the piezoceramic elements are activated together, it is possible to execute z-displacements of the optical element in the $\mu$m-range.

In the case of the adjustment according to the invention, use is made of the effect where piezoceramic elements change shape, in particular change in length, when they are activated electrically. If an appropriate voltage is applied to the piezoceramic elements, the bridge arms correspondingly bend or lengthen, which results in a lifting or lowering movement of the associated bearing location. Via the connection of the bearing location to the optical element, the latter is thus likewise raised or lowered. If this is not executed uniformly around the circumference at all the bearing locations, then individual lifting or lowering movements of the bearing locations result in the optical element tilting. With uniform and simultaneous activation of all the piezoceramic elements, displacement of the optical element in the z-direction takes place.

If the bridge arms are arranged in an inclined or oblique manner, then a more rigid attachment in the z-direction is achieved since force dissipation via the oblique bridge arms is possible as a result. With bridge arms which are horizontal or arranged transversely to the z-direction, in contrast, the result is a very low level of rigidity with corresponding isolation in relation to disruptive forces acting from the outside. In this case, however, it is necessary to take account of the correspondingly lower threshold in relation to natural frequencies.

A further advantageous configuration of the invention may consist in that the bearing locations are provided with recesses.

The recessing at the bearing locations makes it possible to achieve better isolation of disruptive movements which act from the outside.

Further configurations and advantageous developments of the invention can be gathered from the rest of the subclaims and from the exemplary embodiment which is described in principle hereinbelow with reference to the drawing, in which:

BRIEF DESCRIPTION OF THE DRAWINGS

FIG. 1 shows a perspective illustration of the apparatus according to the invention cut in half;

FIG. 2 shows a perspective illustration of a further configuration of the apparatus according to the invention;

FIG. 3 shows an enlarged illustration of a bearing bridge with horizontal bearing arms; and FIG. 4 shows an enlarged illustration of a bearing bridge with inclined bearing arms.

DETAILED DESCRIPTION

The invention is described herein below with reference to two exemplary embodiments.

According to FIG. 1, a lens 1 is arranged in a projection exposure objective 2 (only indicated by dashed lines) for semiconductor lithography. The lens 1 is mounted in an inner mount 3 in a manner which is not illustrated specifically. Between the inner mount 3 and an outer mount 4, via which the lens 1 is connected to the housing of the objective 2, three bearing bridges 5 are distributed over the circumference at spacings of 120°. As can be seen from the enlarged illustration in FIG. 3, each bearing bridge 5 has two bridge arms 6a and 6b, with a bearing location 7 in the form of a pedestal located therebetween. A piezoceramic element 8 in sheet form is located in each case on the top side of a bridge arm 6a, 6b. In the same way, it is likewise possible for piezoceramic elements 8 in sheet form to be arranged on the undersides of the bridge arms 6a and 6b, as is illustrated by dashed lines in FIG. 3.

The bearing location 7 of a bearing bridge 5 is connected to the inner mount 3 via a screw-connection using a screw 9, while bearing means 10 of the bridge arms 6a and 6b are likewise connected to the outer mount 4 via a screw-connection using a screw 11 (see FIG. 1 for the screw-connection).

If a voltage is applied to the piezoceramic elements 8, then the latter undergo a positive change in length of Δl, the ferroelectric effect (piezo effect) preferably being selected such that the change in length is greater in the longitudinal direction of the bridge arms 6a and 6b than in the transverse direction. On account of the bearing means 10 of the bridge arms 6a and 6b being clamped firmly in the outer mount 4, the bridge arms 6a and 6b bend in the arrow direction, to be precise—depending on the activation of the piezoceramic elements 8—upward or downward in the arrow direction. In this way, the bearing location 7 is displaced upward or downward in the arrow direction. On account of the bearing location 7 being connected to the inner mount 3, this results in the optical element 1 tilting. Actuation of the piezoceramic elements 8 of one bearing bridge 5 causes tilting about an axis which extends through the other two bearing bridges.

In the exemplary embodiment illustrated in FIG. 1, the bearing bridges 5, in addition to functioning as actuators, also constitute, at the same time, the elastic connecting members between the outer mount 4 and the inner mount 3.

FIG. 2 illustrates an embodiment in which the inner mount 3, the outer mount 4 and an intermediate ring 12 located therebetween are formed in one piece and are separated from one another by separating cuts 13, apart from narrow transition regions which thus, as solid-state articulations, constitute elastic connecting members 14. In this case, in each case two elastic connecting members 14, situated opposite one another through 180°, located between the outer mount 4 and the intermediate ring 12 and likewise in each case two elastic connecting members 14, likewise situated opposite one another through 180°, are located between the intermediate ring 12 and the inner mount 3. The bearing bridges 5, with their two bridge arms 6a and 6b and the bearing location 7 located therebetween, are offset through 90° in each case in relation to the elastic connecting members 14. The bearing bridges 5 and the elastic connecting members 14 between the outer mount 4 and the intermediate ring 12 and between the inner mount 3 and the intermediate ring 12 are offset through 90° in each case in relation to one another. In this way, upon actuation of the bearing bridges 5 by corresponding activation of the piezoceramic elements 8, adjustment of the lens 1 both in the x- and in the y-direction is possible. Thus, upon activation of the piezoceramic elements 8 on the bearing bridge 5 which is illustrated on the right in the drawing, the lens 1 is tilted by the elastic connecting members 14, located at 90° in relation to the bearing bridge 5, about one axis. In the same way, upon actuation of the piezoceramic elements 8 of the bearing bridge 5 which is illustrated on the left in the drawing, the lens 1 is tilted about the other axis. In both cases, the correspondingly moving bearing locations 7, for tilting the lens 1, raise either the intermediate ring 12 or the inner mount 3. In this case, unlike the exemplary embodiment according to FIG. 1, the piezoceramic elements 8, as actuators, are separated from the elastic connecting members 14. The advantage of this configuration is that this gives a clear tilting point and tilting takes place about the z-axis or optical axis, while, in the exemplary embodiment according to FIG. 1, tilting results in a slight axial offset.

The piezoceramic elements 8 may be connected to the bridge arms 6a and 6b in a variety of different ways. One possibility is adhesively bonding the thin sheets onto the bridge arms 6a, 6b. It is also possible for the application to take place via a coating operation, in which the piezoceramic element 8 is directly applied to the substrate, in this case the bridge arms 6a, 6b, or can be grown on the substrate and then correspondingly structured or contact-connected.

The separating cuts 13 according to the exemplary embodiment of FIG. 2 may be made, for example, by erosion. It is possible for the piezoceramic elements 8 to be activated both individually, in order to execute a defined tilting movement, and together and to the same extent. In the latter case, the lens 1 is displaced in a z-direction, i.e. in the direction of the optical axis.

FIG. 4 illustrates a bearing bridge 5 which is basically of the same construction as the bearing bridge 5 illustrated in FIGS. 1 to 3. The only difference is that the two bridge arms 6a and 6b, rather than running horizontally or perpendicularly to the bearing and connecting locations, are oblique or inclined and thus also located obliquely in relation to the z-axis, the bearing location 7 being located between the two bridge arms 6a and 6b, to be precise at the highest point. This achieves a higher level of rigidity for the attachment.

Here too, it is possible for the piezoceramic elements 8, in sheet form, to be located both on the top side and on the underside of the bridge arms 6a, 6b. In the same way as in the exemplary embodiment according to FIG. 3, the bridge arms 6a, 6b move upward or downward upon corresponding activation of the piezoceramic elements 8. In this case, however, it is also possible to activate both the piezoceramic elements 8 on the top sides and those on the undersides, this resulting in the respectively associated bridge arms 6a or 6b lengthening, which causes the bearing location 7 to be displaced in the upward direction.

In each case one recess 15 is located at the locations of attachment of the two bridge arms 6a and 6b to the pedestal-like bearing location 7. A further recess is located in the central region of the bearing location 7—in relation to the height thereof. The recesses 15 achieve better isolation of disruptive movements which act on the lens 1 from the outside.

What is claimed is:

1. An adjusting apparatus for an optical element in a lens system, for producing tilting movements, having at least one actuator, the optical element being connected via elastic connecting members, directly or indirectly via an inner mount, to an outer mount, wherein the elastic connecting members or the at least one actuator are/is provided in each case with bearing bridges which have bearing locations for a connection to the optical element, or the inner mount, and bridge arms which are connected to the bearing locations, said bridge arms being provided with piezoceramic elements in plate or sheet form which undergo changes in length upon activation, wherein said piezoceramic elements of the various bearing bridges are activatable, individually or together.

2. The apparatus as claimed in claim 1, wherein said piezoceramic elements are each arranged on a top side of a bridge arm.

3. The apparatus as claimed in claim 1, wherein said piezoceramic elements are each arranged on an underside of a bridge arm.

4. The apparatus as claimed in claim 1, wherein said piezoceramic elements are each arranged on a top side and on an underside of a bridge arm.

5. The apparatus as claimed in claim 4, wherein said piezoceramic elements of the top side and of the underside can be activated individually or together.

6. The apparatus as claimed in claim 1, wherein a ferroelectric effect (Piezo effect) is more pronounced in a longitudinal direction of the bridge arms than in a transverse direction.

7. The apparatus as claimed in claim 1, wherein said piezoceramic elements are adhesively bonded to the bridge arms.

8. The apparatus as claimed in claim 1, wherein said piezoceramic elements are applied to the bridge arms by a coating operation.

9. The apparatus as claimed in claim 1, wherein said bearing locations are provided with recesses.

10. The apparatus as claimed in claim 1, wherein locations of attachment of the bridge arms to the bearing locations are provided with recesses.

11. The apparatus as claimed in claim 1, wherein said bearing locations and locations of attachment of the bridge arms to the bearing locations are provided with recesses.

12. The apparatus as claimed in claim 1, wherein said bridge arms are inclined, the bearing location, which is located in each case between two bridge arms, being at the highest point of the inclination.

13. The apparatus as claimed in claim 1, wherein the inner mount and the outer mount are formed in one piece, and wherein the separating locations for the elastic connecting members are formed by separating cuts between the inner mount and outer mount, an actuator with a bearing bridge being arranged in each case between two connecting members.

14. The apparatus as claimed in claim 1, wherein the inner mount, the outer mount and an intermediate ring are formed in one piece, and wherein the separating locations for the elastic connecting members are formed by separating cuts between the inner mount and outer mount and the intermediate ring, an actuator with a bearing bridge being arranged in each case between two connecting members.

15. The apparatus as claimed in claim 13, wherein the connecting members and the actuators with the bearing bridges are distributed over the circumference in each case such that they are offset through 90° in relation to one another.

16. The apparatus as claimed in claim 14, wherein the connecting members and the actuators with the bearing bridges are distributed over the circumference in each case such that they are offset through 90° in relation to one another.

17. The apparatus as claimed in claim 15, wherein the connecting members and the actuators with the bearing bridges are distributed over the circumference in each case such that they are offset through 90° in relation to one another.

18. The apparatus as claimed in claim 13, wherein said separating cuts are formed by eroding cuts.

19. The apparatus as claimed in claim 14, wherein said separating cuts are formed by eroding cuts.

20. The apparatus as claimed in claim 15, wherein said separating cuts are formed by eroding cuts.

21. The apparatus as claimed in claim 1, wherein three bearing bridges are distributed over the circumference, the bearing locations being connected to the inner mount in each case via a screw-connection and bearing means of the bridge arms being connected to the outer mount in each case via a screw-connection.

22. The apparatus as claimed in claim 1, wherein three bearing bridges are distributed over the circumference, the bearing locations being connected to the optical element in each case via a screw-connection and bearing means of the bridge arms being connected to the outer mount in each case via a screw-connection.

23. The apparatus as claimed in claim 1, wherein said piezoceramic elements are activatable together and to the same extent displacing the optical element in a z-direction.

24. An adjusting apparatus for a lens in a projection exposure objective for semiconductor lithography for producing tilting movements, having at least one actuator, the lens being connected via elastic connecting members, directly or indirectly via an inner mount, to an outer mount, wherein the elastic connecting members or the at least one actuator are/is provided in each case with bearing bridges which have bearing locations for a connection to the lens, or the inner mount, and bridge arms which are connected to the bearing locations, said bridge arms being provided with piezoceramic elements in plate or sheet form which undergo changes in length upon activation, wherein said piezoceramic elements of the various bearing bridges are activatable, individually or together.

* * * * *